United States Patent [19]

Nakamura et al.

[11] Patent Number: 4,605,943
[45] Date of Patent: Aug. 12, 1986

[54] COMPOSITE OPTICAL SEMICONDUCTOR DEVICE

[75] Inventors: Masaru Nakamura, Kawaguchi; Kouichi Nitsuta, Yokohama; Takeshi Ozeki, Tokyo, all of Japan

[73] Assignee: Tokyo Shibaura Denki Kabushiki Kaisha, Kawasaki, Japan

[21] Appl. No.: 571,379

[22] Filed: Jan. 16, 1984

[30] Foreign Application Priority Data

Jan. 14, 1983 [JP] Japan ................................. 58-3359

[51] Int. Cl.⁴ ............................................. H01L 33/00
[52] U.S. Cl. .................................... 357/17; 357/19
[58] Field of Search ............................... 357/17, 19

[56] References Cited

PUBLICATIONS

*Electronics Letters;* "In GaAsP/InP LED's Integrated With Monitoring Detector"; Sakai et al.; vol. 18; 1982; pp. 157-158.

*Primary Examiner*—William L. Sikes
*Assistant Examiner*—Robert E. Wise
*Attorney, Agent, or Firm*—Oblon, Fisher, Spivak, McClelland & Maier

[57] ABSTRACT

A composite optical semiconductor device which includes a light emitting element and a light detecting element formed in a single body. The light detecting element is formed in the shape of a circle, with the light emitting element being formed within the circle. The electrode configuration of the light emitting and light detecting elements is such that the current path of the light emitting element does not overlap with that of the photo detecting element, whereby the light detecting element can obtain an accurate monitoring current indicative of the light emitted from the light emitting element.

10 Claims, 4 Drawing Figures

COMPOSITE OPTICAL SEMICONDUCTOR DEVICE

BACKGROUND OF THE INVENTION

1. Field of the Invention

This invention relate to a composite optical semiconductor device including a light emitting element and a light detecting element formed in one body.

2. Description of the Prior Art

A light emitting diode (LED) has an output characteristic exhibiting temperature dependent fluctuations smaller than that of a semiconductor laser device. The LED output characteristic is also more linear. Further, a LED is a source or light easy to use, except for the problems of power level and response speed. But, if the LED is actually used in an analog transmission system, nevertheless the fluctuation of its output characteristic must be compensated.

Nowadays, a wideband opto-electric negative feedback (NFB) loop is widely used for compensating both the temperature dependent fluctuation and the nonlinearity of the LED at the same time, as explained in the paper MJ2 of IOOC '81, San Francisco in U.S.A. (1981). In the wideband opto-electric NFB loop, nonlinear distortion of the LED is compensated by a negative feedback of a part of the LED light output to a drive circuit driving the LED after detecting the part of the light output of the LED. Then it is desirable to construct in a single body a light emitting element and a light detecting element in order to compensate for the nonlinear distortion.

A prior art composite optical semiconductor device, which includes in one body a LED and a photo detector (PD), is shown in FIG. 1. In the prior art device, the LED is constructed as follows. A P-type GaAlAs layer 3 is formed on an N-type GaAs current confinement layer 2 which is formed on a P-type GaAs substrate 1. The P-type layer 3 penetrates the current confinement layer 2 in the center area thereof. An N-type GaAlAs layer 5 is formed on an N-type GaAs active layer 4 which is formed on the P-type layer 3. The LED emits light in the active layer 4 by applying a voltage between a first electrode 6 and a second electrode 7. A PD comprises the N-type GaAlAs layer 5, a GaAlAs intrinsic layer 8 and a P-type GaAs layer 9. As the GaAlAs layer 8 detecting the light of the LED has a low impurity concentration, the PD has a P-I-N construction. The PD is operated by applying a voltage between a third electrode 10, formed on the P-type GaAs layer 9, and the second electrode 7. Namely, the N-type GaAlAs layer 5 and the electrode 7 are commonly used for both the LED and the PD. In this structure, light emitted from the active layer 4 is detected by the PD and is transmitted to the outside through a light transmitting portion 11 which is formed in the center of the device. The light output from the transmitting portion 11 enters into an optical fiber 12. The electrical output of the PD supplies an outside electrical circuit which is part of a wideband opto-electric NFB loop in order to control the LED driver circuit.

In the wideband opto-electric NFB loop, it is necessary to obtain an exact monitoring current dependent on the light emitted from the LED which passes to the PD. The PD detects this part of the light output of the LED. But it is difficult to get a correct monitoring current in the prior art device because in the prior art device, the electrode 7 is commonly used for both the LED and the PD and is constructed outside of the detecting portion of the PD. Thus, the current path of the LED is close to that of the PD, and both paths partly overlap each other. Therefore, a leakage current flows from the LED to the PD, and the PD may detect an erroneous monitoring current of the light of the LED.

SUMMARY OF THE INVENTION

It is accordingly an object of this invention to provide a novel composite optical semiconductor device in which a current path of a light emitting element does not overlap with that of a photo detecting element.

Another object of this invention is to provide a novel composite optical semiconductor device which includes a light emitting element and a light detecting element formed in a single body and in which the light detecting element can obtain an accurate monitoring current indicative of the light emitted from the light emitting element.

These and other objects are achieved according to this invention by providing a new and improved composite optical semiconductor device including a light emitting element which is formed from a first region having a first conductivity type which is formed in a semiconductor substrate. A second region is formed on top of this first region and has a second conductivity type. The area between the first and second regions forms a PN junction. A first electrode is connected to the bottom of the first region while a second electrode is connected to the top of the second region. The second region includes a light transmitting portion which transmits light emitted when a voltage is applied between the first and second electrodes. A light detecting element is formed from this second region and a third region which is formed on top of the second region. This light detecting element detects part of the emitted light. A third electrode is connected to the top of the third region. A circuit is formed between the second and third electrodes including the second and third regions to give an indication of the detection of the emission of light. The second electrode is formed in the shape of a circle and lies inside the third region and third electrode which are also formed as a circle. By placing the second electrode near the center, the current path for the light emitting element is separated from the current path of the photodetector so that a leakage current does not occur between the two. Thus, the accuracy of the photodetection element increases by this arrangement.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENT

Figure 1:
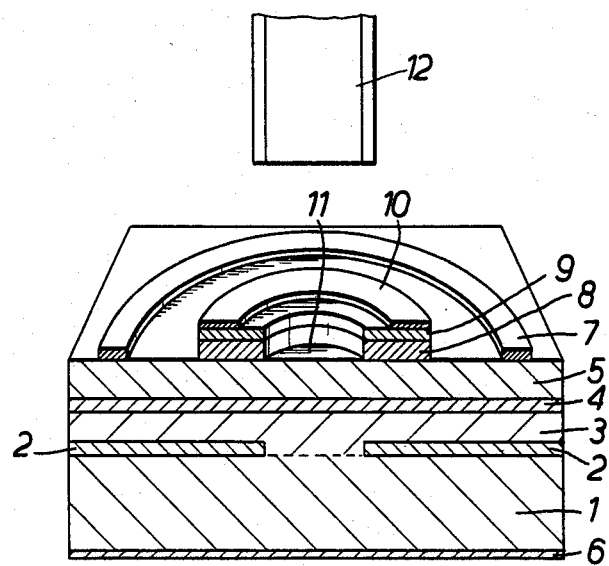
FIG. 1 is a diagrammatic view, partly in cross-section, of a prior art composite optical semiconductor device.
Figure 2:
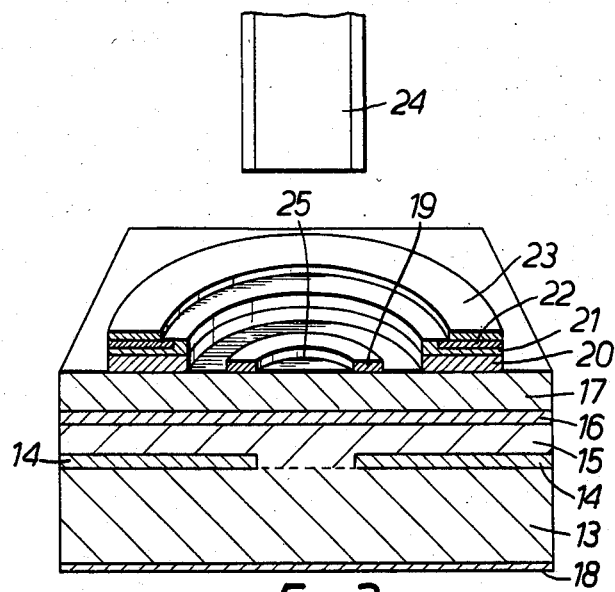
FIG. 2 is a diagrammatic view, partly in cross-section, of a preferred embodiment of this invention.

Referring now to the drawings, wherein like reference numerals designate identical or corresponding parts throughout the several views, and more particularly to FIG. 2 thereof, a first embodiment of this invention is explained.

In the first embodiment, a P-type GaAs substrate 13 is used as a substrate of a LED. The substrate 13 has impurities of a concentration of $1 \times 10^{18}$ cm$^{-3}$ and a thickness of 100 to 200 μm. A current confinement layer 14 is formed on the substrate 13 and is provided with a window in order to concentrate the current of the LED and to obtain a high light emitting efficiency. The confinement layer 14 is made of N-type GaAs having impurities of a concentration of $1 \times 10^{18}$ cm$^{-3}$ and a thickness of 4 to 5 μm. A first component layer 15 is formed within the area of the window of the confinement layer 14 on the substrate 13 and on the current confinement layer 14. The first component layer 15 is made of P-type Ga$_{1-x}$Al$_x$As having impurities of a concentration of $1 \times 10^{18}$ cm$^{-3}$ and a thickness of 4 to 5 μm, wherein x is 0.3 to 0.4. An active layer 16 is made of N-type GaAs having impurities of a concentration of $1 \times 10^{18}$ cm$^{-3}$ and a thickness of 1 μm. A second component layer 17 is made of N-type Ga$_{1-x}$Al$_x$As having impurities of a concentration of $1 \times 10^{18}$ cm$^{-3}$ and a thickness of 5 μm, wherein x is 0.3 to 0.4. In this structure, light is emitted in the active layer 16 by applying a voltage between a first electrode 18 and a second electrode 19. The electrodes 18 and 19 are made of metal.

As a part of a PD, a circular GaAlAs layer 20 is formed on a part of said N-type layer 17, the latter being used as a component of the PD and also as the second component layer 17 of the LED. The GaAs layer 20 has impurities of low concentration, as they are used for an intrinsic layer, and a thickness of about 10 μm. A P-type GaAs layer 21 is formed on the GaAlAs layer 20. The GaAs layer 21 has a thickness of 3 μm and impurities of a concentration of $1 \times 10^{18}$ cm$^{-3}$. A P-type GaAs layer 22 is formed in the P-type GaAs layer 21 in order to have a good ohmic contact with a third electrode 23 made of metal.

The P-type GaAs layer 22 has a greater concentration of impurities than that of the P-type GaAs layer 21. The PD can be operated by applying a voltage between the third electrode 23 and a second electrode 19 which is also the second electrode 19 of the LED. The electrode 19 has a width of about 30 μm and is formed circularly inside of and spaced from the detecting portion i.e. the intrinsic layer 20 of the PD. The detecting portion of the PD has a width of about 50 μm to 70 μm.

In this structure, part of the light output from the active layer 16 of the LED is detected by the PD and a part of the light output enters an optical fiber 24 through a light transmitting portion 25 which is inside and outside of the nontransparent electrode 19. At the same time, the electrical output of the PD is led to an outside electrical circuit, part thereof being a wideband opto-electric NFB loop. In this case the electrode 19, which is commonly used for the LED and for the PD, is formed inside of the photo detecting portion, and is generally grounded. Therefore the current paths of the LED and the PD are separated from each other sufficiently and do not overlap each other, and a leakage current from the LED to the PD is prevented. The PD accurately detects the monitoring current of the LED.

In this embodiment, the electrode 19 may be in the form of a triangular, square, polygonal or ellipse instead of a circle. But the efficiency of the light output must be considered because the electrode is generally made of nontransparent material.

Figure 3:
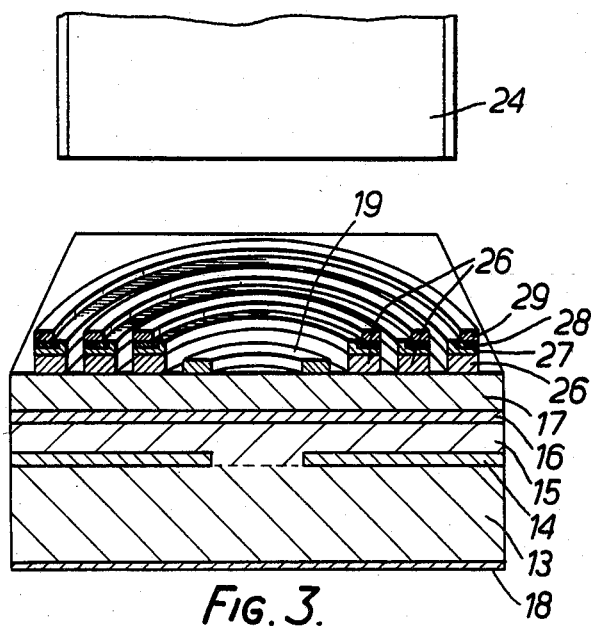
FIGS. 3 and 4 are diagrammatic views, partly in cross-section of further embodiments of this invention.

Another embodiment is shown in FIG. 3. An LED is formed similarly to the first embodiment according to FIG. 2. But in this case the PD has a plurality of detecting portions. Namely, the detecting portion of the PD according to the first embodiment is divided into plural parts arranged concentrically on the second component layer 17. The PD includes three concentric GaAs layers 26, which have impurities of low concentration, P-type GaAs layers 27, P-type GaAs layers 28 for good ohmic contact, and third electrodes 29. The plural detecting portions are formed as concentric circles outside of the second electrode 19 which is also one of the electrodes of the LED. The third electrodes 29 of the PD are short circuited to one another and connected to ground potential. In this structure, the light output from the LED enters also an optical fiber 24. The non-linear characteristic of the light of the center is generally different from that of the light of the periphery. According to this embodiment, the optical fiber 24 receives the light from the entire surface of the device. At the same time, a part of the light is detected by the photodetecting portions 26 and the PD monitors the light of the LED more accurately. As the photo detecting portions 26 are divided into plural parts, compared with the device according to FIG. 2, sufficient light from the LED enters the optical fiber 24.

Figure 4:
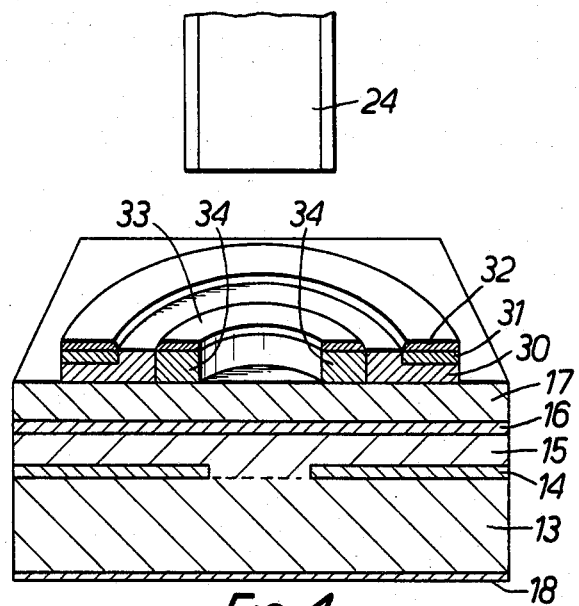

Another embodiment is shown in FIG. 4. In this embodiment an LED is formed similar to the first embodiment shown in FIG. 2. A PD is formed on a second component layer 17 of the LED. A GaAs layer 30, which has impurities of a low concentration, is formed on part of the N-type layer 17 and a P-type GaAs layer 31 is formed thereon. The PD has also a P-I-N structure and can be operated by a voltage between a third electrode 32 and a second electrode 33. The second electrode is connected to the N-type layer 17 through an N-type region 34, the concentration of impurities thereof being higher than the concentration of impurities of the N-type layer 17. The second electrode 33 of the PD is also one of the electrodes of the LED. In this structure the light output from the LED enters an optical fiber 24 similarly as in the embodiment according to FIG. 2 and is detected and monitored by the PD and the outside circuit at the same time. It is easy to align a mask in a manufacturing step producing this embodiment. Namely, the electrodes 19 of the first and second embodiments must be formed on the depressed portions after having formed the PD, but the electrode 33 of this embodiment can be formed easily and precisely on the N-type region 34.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A composite optical semiconductor device comprising:
   a first region having a first conductivity type formed in a semiconductor substrate;

a second region having a second conductivity type formed on top of said first region, thereby forming a PN junction at the boundary between said first region and said second region;

a first electrode connected to said first region;

a second electrode formed on top of said second region;

said first and second electrodes and first and second regions thereby forming a light emitting diode so that is emitted when a voltage is applied between the first and second electrodes;

said second region including a light transmitting portion for transmitting light emitted by said light emitting diode;

a third region formed on top of said second region;

a third electrode formed on top of said third region;

said second and third electrodes and said second and third regions forming a photodetecting element for detecting light emitted from said light emitting diode;

said second electrode being arranged within the third electrode in the area of the light transmitting portion;

wherein the current path for the light emitting diode between said first electrode and said second electrode is separated from the current path of the photodetecting element between said second electrode and said third electrode.

2. A composite optical semiconductor device according to claim 1, wherein the third region and third electrode are formed as circular rings.

3. A composite optical semiconductor device according to claim 2, wherein the third region comprises:

a plurality of concentric rings spaced from each other and arranged around the second electrode, said third electrode connected to each of the concentric rings.

4. A composite optical semiconductor device according to claim 1, wherein the third region comprises:

a plurality of concentric rings spaced from each other and arranged around the second electrode, said third electrode connected to each of the concentric rings.

5. A composite optical semiconductor device according to claim 1, wherein the third region has the first conductivity type.

6. A composite optical semiconductor device according to claim 1, wherein the third region comprises:

an intrinsic layer adjacent to the second region.

7. A composite optical semiconductor device according to claim 6, further comprising:

an optical fiber arranged above the area determined by the aperture of the current confinement layer.

8. A composite optical semiconductor device according to claim 1, further comprising:

a current confinement layer with an aperture formed in the first region in order to confine current between the first electrode and the second electrode.

9. A composite optical semiconductor device according to claim 1, further comprising:

a fourth region formed adjacent to the third region with the same conductivity type as the second region, said second electrode formed on the fourth region.

10. A composite optical semiconductor device according to claim 1, further comprising:

an active layer formed between the first region and the second region.

* * * * *